United States Patent [19]

Behringer et al.

[11] Patent Number: 4,578,587
[45] Date of Patent: Mar. 25, 1986

[54] ERROR-CORRECTED CORPUSCULAR BEAM LITHOGRAPHY

[75] Inventors: Uwe Behringer; Harald Bohlen, both of Ammerbuch; Peter Nehmiz, Stuttgart; Werner Zapka, Gaertringen-Rohrau, all of Fed. Rep. of Germany

[73] Assignee: International Business Machines Corporation, Armonk, N.Y.

[21] Appl. No.: 694,888

[22] Filed: Jan. 25, 1985

[30] Foreign Application Priority Data

Mar. 24, 1984 [DE] Fed. Rep. of Germany ..... 34108885

[51] Int. Cl.⁴ .................... H01J 37/304; H01J 37/317
[52] U.S. Cl. ............................... 250/492.2; 250/491.1
[58] Field of Search .............. 250/492.2, 492.21, 491.1

[56] References Cited

U.S. PATENT DOCUMENTS 4,169,230 9/1979 Bohlen et al. .................... 250/492.2
4,370,554 1/1983 Bohlen et al. .................... 250/491.1

Primary Examiner—Alfred E. Smith
Assistant Examiner—Jack I. Berman
Attorney, Agent, or Firm—Francis J. Thornton

[57] ABSTRACT

An apparatus and method for testing transmission masks for corpuscular lithography, in which an image of a portion of mask is guided across a pinhole diaphragm, comprising at least one aperture with submicron dimensions, by inclining the corpuscular beam. The relative spacing of two measuring points is derived from the interferometrically measured table displacement and the beam inclination. This test for geometrical errors is effected by placing below the single hold in the diaphragm a scintillator followed by a photomultiplier coupled to an output circuit.

For testing the entire mask area for errors and impurity particles, a multihole diaphragm, having submicron apertures arranged in matrix fashion, can be used above an integrated circuit of the charge transfer type which provides a MOS capacitor as a particle detector underneath each diaphragm opening. The exposure mask is scanned in steps, effecting several single exposures at each position by inclining the beam.

10 Claims, 7 Drawing Figures

ERROR-CORRECTED CORPUSCULAR BEAM LITHOGRAPHY

FIELD OF THE INVENTION

The invention relates to an apparatus for detecting errors in masks for corpuscular beam lithography and to methods of generating error-corrected mask images in corpuscular beam lithographic systems.

BACKGROUND OF THE INVENTION

For the lithographic generation of patterns with elements in the micron and submicron range, such as integrated semiconductor circuits, conventional photolithographic methods reach their physical limits that are set by the light wave length. If corpuscular beams, such as electron or ion beams, are used for exposure, then the limits are extended far into the submicron range; on the other hand, at such small dimensions the problems connected with mask accuracy and purity and errors caused by the lithographic system itself during exposure are aggravated.

Of the previously tested corpuscular beam lithographic processes and means, so-called proximity printers, wherein a transmission mask is imaged by a wide diameter electron beam at a 1:1 scale on a substrate covered with an electron-sensitive layer, are of particular interest. Such arrangements afford a high throughput and thus an inexpensive production process. Details of the related processes are described, for instance, in the article "Electron-beam proximity printing—a new high-speed lithography method for submicron structures" by H. Bohlen et al. in IBM J. Res. Devel., Vol. 26, No. 5, September 1982, p. 568 et seq. That method provides for the substrate to be shifted in steps, generating in each case a mask shadow projection image corresponding, for example, to a complete semiconductor chip. Mask errors, impairing the operation of the semiconductor circuit, may lead to the entire exposed substrate becoming unusable.

Therefore, such processes necessitate that the mask and the imaging characteristics of the entire lithographic system be tested to ensure that they are error-free, focusing in particular on the following errors:

erroneous mask patterns,
 mask distortions,
 impurity particles on the mask,
 errors in the imaging system.

Mask distortions may occur, for example, if the mask is unduly heated during its manufacture or by the incident beam. Errors of the imaging system affect, for instance, in an uncontrollable manner the inclination of the parallel beam incident on the mask, thus leading to displacements in the shadow image. Causes of such errors may be insufficiently homogeneous magnetic fields or changes in the magnetic field by induced eddy currents occurring when a relatively thin electron beam is made to rapidly raster-scan the mask for its full illumination.

For compensating for geometrical mask errors, the inclination of the electron beam is locally altered during the above-described raster illumination, so that the shadow image is displaced accordingly. This method necessitates, however, that the mask errors be known with great precision. With steadily smaller structures, such measurement is extremely elaborate and expensive, the main difficulty being that the apparatus required for measuring is not readily controllable with regard to error sources. Moreover, distortions of the shadow projection image, that are caused by inaccuracies of the remaining lithographic system rather than by mask errors, cannot be controlled in that way.

For accurately measuring masks with submicron structures, the probes used must be extremely fine, in order to reach the desired resolution. With such fine probes, for example, a strongly focused electron beam, the local thermal load on the tested mask increases, or the measuring signal available is extremely low and subject to much noise.

The transmission masks necessary for shadow projection corpuscular beam lithgraphy represent the mask pattern as physical apertures (hole pattern), as no material is known that is completely transparent to corpuscular beams. Such masks are particularly sensitive to impurity particles which even in hyperpure rooms settle on the mask, thus drastically reducing the yield of very large scale integrated circuits. Protecting a mask against impurity particles by protective foils, as is done in optical photolithography, is, therefore, ineffective, with corpuscular beams.

SUMMARY OF THE INVENTION

It is the object of the present invention to provide an apparatus of the above-described kind, whose resolution is of the order of nanometers and which detects as many error sources as possible that may lead to inaccurate shadow projection. In addition, a method for correcting the detected mask errors during exposure is taught.

In the present invention the mask is impinged upon by the same electron beam as is used for shadow projection lithography. The shadow projection pattern generated by the mask is scanned through a pinhole diaphragm having an aperture with a diameter of typically 0.5 $\mu$m and which is displaced relative to the mask. Such relative displacement with a high spatial resolution can be achieved by altering the inclination of the electron beam. A Highly responsive detector such as a scintillator followed by a secondary electron multiplier is arranged behind the diaphram aperture to generate from the low electron current a measuring signal with an adequate signal-to-noise ratio.

By means of the single hole diaphragm, the mask geometry can be extremely accurately determined at selected points; the obtainable resolution is about 25 nm. If the electron beam is tilted in two dimensions, it is possible to image by the single hole diaphragm small mask sections on a point-by-point basis, thus generating, similar to a scanning electron microscope, an image of the respective mask section.

Typically, for measuring the mask geometry, the single hole diaphragm, together with the detector, is fixed on the X-Y table carrying a substrate such as a semiconductor wafer to be exposed. Suitable portions of the mask structure, representing the pattern to be exposed, are used as measuring structures. These mask portions or points, which may be arbitrarily selected, are then positioned below the pinhole diaphragm by moving the table and, if necessary, accurately aligned, using the above-described two-dimensional imaging process. With the mask being fixed, the angle of inclination of the electron beam is subsequently altered, thus guiding the shadow projection image of the selected mask point across the pinhole diaphragm. The accurate position of the selected mask element may be derived from the relative position of the measuring signal with respect to the saw-tooth voltage used for beam tilting, taking into account the displacement of the detector from one measuring point to another which is very accurately interferometrically measured.

In that manner, distortions and geometrical errors of the mask may be determined in a relatively short time, using only a few selected mask points. The correction signals, which, during mask exposure, may be used to momentarily alter the angle of inclination of the electron beam, may be derived from those measuring results. As in the above-described measuring step with the single hole diaphragm not only the mask errors but also the errors in the exposure system lead to displacements of the shadow image, and exposure is effected without changing or rebuilding that system, the corrections also cover inevitable errors in the lithographic system. Thus shadow projection images are obtained which very accurately correspond to the projection of an ideal mask in an ideal exposure system.

The very small pinhole diaphragm required by the high resolution would make the scanning of the entire mask very time-consuming. However, for detecting, in addition to distortions, other mask defects or impurity particles, the entire mask has to be scanned.

The invention avoids this time problem by using a multihole diaphragm. In this diaphragm are apertures whose typical size is 0.5 $\mu$m are arranged in a matrix fashion and integrated with a multiple element charge transfer type circuit that serves as an electron detector such that each aperture in the mask constitutes a window that transmits electrons to distinct elements of the electron detecting circuit arranged underneath it. This diaphragm-circuit combination is guided in steps across the shadow image of the mask, being illuminated at each position at different angles of inclination of the electron beam. The electrons transversing the apertures are collected in the underlying semiconductor circuit and are serially read out for evaluation. The image of the mask is formed from the totality of the images thus recorded and compared with an electronically stored ideal pattern, in order to detect, for instance, impurities on the mask. In that case, the scanning time for the entire mask is of the order of minutes.

Thus, the entire mask can be tested in the same system that is used for exposure, so that having been found free from errors and impurity particles, the mask can be directly exposed, without having to be removed from the system thus avoiding a possibility of further contamination.

DESCRIPTION OF THE DRAWINGS

Further details and advantages of the invention will be described in detail below with reference to drawings, in which.

DESCRIPTION OF THE INVENTION

Figure 1:
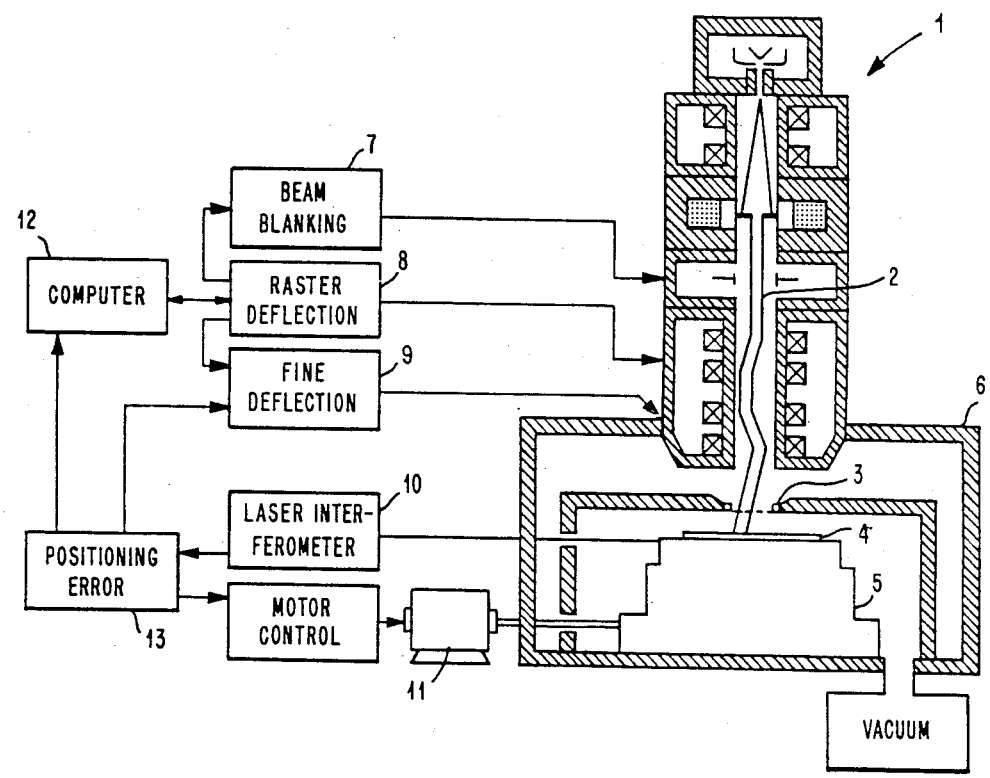
FIG. 1 is a schematic block diagram of an apparatus for electron beam lithography, in which the present invention may be used.

FIG. 1 is a schematic of the layout of a known arrangement for electron beam lithography in which the present invention may be used. The electron beam column 1 comprises means for generating the electron beam 2, and for its shaping and deflection. For that purpose, known electron sources, diaphragms, electron lenses, electrostatic and magnetic deflection systems are used. The electron beam 2 impinges upon a transmission mask 3 for generating a shadow image on the substrate 4, which may be for example, a semiconductor wafer. The diameter of the electron beam 2 is preferably smaller than the diameter of the opening in the mask 3, so that for fully illuminating the mask, the latter is raster-scanned by the beam. Wafer 4 is generally larger than the mask 3, so that for its full exposure several individual exposures are required at different positions. For that purpose, the wafer is displaced by means of an X-Y table 5 which is driven by motor 11 connected thereto. The accurate position of the table is determined by a laser interferometer 10. The entire set-up, i.e. the wafer, the table and the beam is kept in a vacuum in housing 6.

Data on the current position established by the laser interferometer 10 are fed through an error positioning circuit 13 for position measurement and a computer 12 connected thereto to a fine deflection control 9 of the electron beam which, for compensating for small positional errors, suitably corrects the inclination of the electron beam 2. A raster deflection means 8 for raster scanning the mask and beam blanking means 7 for interrupting the exposure step complete the lithographic system.

Transmission masks of the kind employed for the described purpose consist, for example, of a very thin, tightly stretched foil which is provided with a hole pattern. The production process of such a mask is described, for example, in the article by Behringer et al. In IBM Technical Disclosure Bulletin, Vol. 26, No. 2, July 1983, page 690.

Figure 2:
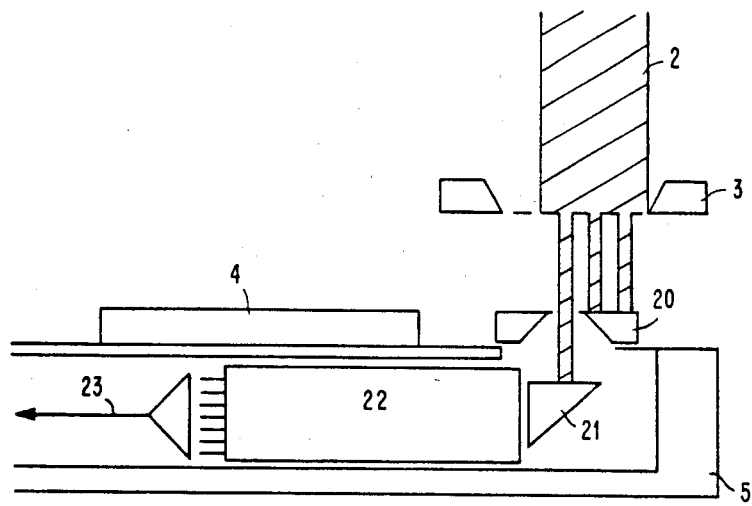
FIG. 2 shows the schematic layout of an apparatus for testing the mask geometry by means of a single hole diaphragm in accordance with one embodiment of the present invention.

FIG. 2 shows a first embodiment of the invention in the form of a single hole diaphragm for accurately determining the geometrical shape of the mask 3 by means of selected mask positions. For that purpose, a diaphragm 20, having a single, very small hole of typically 0.5 $\mu$m (diameter or lateral length), is provided on the X-Y table 5 outside the support area of wafer 4. Such a mask may be lithographically defined and be produced by etching.

Below the single hole diaphragm 20, a scintillator 21 is positioned, in which the impinging electrons of beam 2 produce light flashes. These light flashes are fed, at the mirrored edges of the scintillator 21 or by total reflection, to the photosensitive surface of a secondary electron multiplier (photomultiplier) 22, in which electrons are highly amplified, to result in an electronic output signal which may be fed through line 23 to suitable amplifier and evaluator circuits (not shown).

Figure 3A:
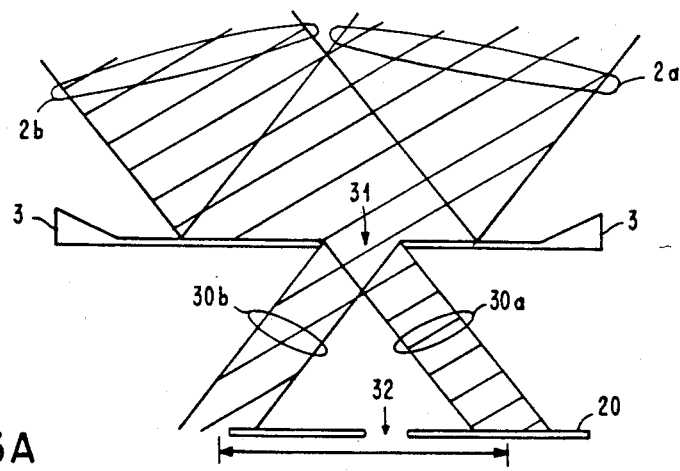
FIG. 3A is a schematic of the measuring process using the present invention in the arrangement according to FIG. 2 with a tilted electron beam.

The measuring process for determining the geometrical shape of the mask 3, for example, for determining mask distortions, proceeds as follows. On mask 3 a number of points are selected and their ideal positions determined. These mask points may be related to structures present on the mask such as apertures with a lateral length of 1×1 μm or horizontal or vertical lines with widths of about 1 μm. Special measuring marks, which are introduced into the mask only for that purpose, are not necessary in this case, but may be used. For determining the geometrical shape of the mask 3, twenty such points distributed across its entire surface are sufficient. At the beginning of measuring, the single hole diaphragm 20 is positioned and locked underneath one of the selected points by means of the X-Y table. According to FIG. 3A, the electron beam 2 is subsequently tilted into two extreme positions 2a and 2b, thus generating below the selected aperture 31 in mask 3 a partial beam moving across the small aperture 32 of the single hole diaphragm 20. The distance between the two extreme positions 30a, 30b of the partial beam is approx. 4 μm.

Figure 3B:
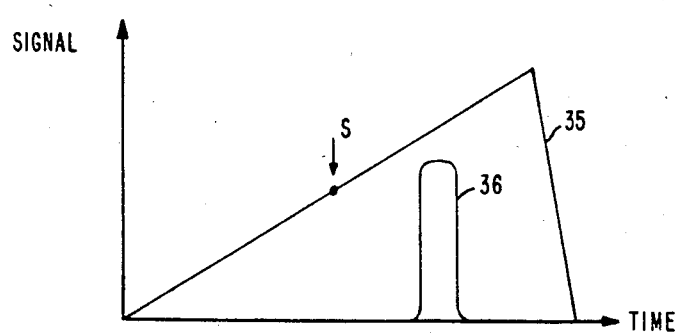
FIG. 3B shows the measuring signal after the beam has been tilted according to FIG. 3A.

If the selected pattern element, say, the aperture 31 of the mask 3, is positioned directly perpendicularly above the aperture 32 of the single hole diaphragm 20, photomultiplier 22 emits an output signal 36 which is symmetrical to the deflection voltage 35 for tilting the electron beam 2; in other words, the symmetry point S of the deflection corresponds to the voltage level for 0 deflection (perpendicular incidence) in an electrostatic deflection system, for example. Alternatively, there is, according to FIG. 3B, a larger or less larger displacement of the detector signal 36 with respect to the symmetry point S of the saw-tooth curve 35 for beam inclination.

After the first selected mask point has been measured with respect to its position, the single hole diaphragm 20, by displacing the X-Y table, is moved to the next selected point below the mask, where the same measurement is repeated. From the interferometrically measured displacement between the two points and the two measuring signals of the photomultiplier, the relative spacing of these two points can be very accurately determined. The relative spacings of all other selected mask points are similarly determined. For accurate position determination at each mask point, it is also possible to perform two beam inclinations in planes perpendicular to each other.

In lieu of a stationary electron beam 2, the above-described measuring process may also be effected by means of a scanning electron beam, as is used for the actual exposure of wafer 4 through mask 3. For that purpose, electron beams with a diameter of about 1 mm are typically used, which in 1 msec., are guided, in raster fashion, along a strip across the mask length of about 10 mm. Thus, each 1 μm pattern element of the mask selected for accurate position measurement is illuminated by the beam for about 100 μsec; this time is sufficient for symmetrically inclining the electron beam in two planes perpendicular to each other, as described above. In that manner, the position of the shadow image below the selected mask position may be determined under real operating conditions of the whole lithographic system.

From the actual shadow image positions of the selected mask elements thus measured, correction parameters may be computed by comparison with ideal positions given by the mask layout. These parameters may be used later on to control the exposure of the wafer by locally altering the inclination of the beam. The computation of these correction terms, which becomes necessary if the distortion is known, and the appropriate control of the fine deflection 9 in FIG. 1 are known from the art.

By means of the correction values thus determined a shadow projection image of mask 3 is obtained on wafer 4 which does no longer include mask errors but which constitutes a very accurate image of the ideal mask structure. Deviations from the ideal position are limited to about 25 nm if the dimensions of the pinhole diaphragm are 0.5 μm.

In addition to the above-described one-dimensional scanning of a selected pattern element by inclining the electron beam in one plane, another operating mode is conceivable in which the inclination of the electron beam 2 is simultaneously changed in two planes perpendicular to each other, with one change being effected slowly and the other rapidly. In that manner, not only a one-dimensional strip of the mask reaches the visual field of the single hole mask during beam tilting but also a small areal portion of the entire mask with the typical dimensions of 6×6 μm. This areal portion is imaged by the single hole mask and may be visually represented on an oscilloscope. This operating mode of the proposed arrangement may be advantageously used during the movement of the X-Y table to select from within the larger area the mask opening provided for precision measuring. The raster scanning electron beam may also be used for this process.

The resolution yielded by the above-described measuring method is mainly due to the extremely small opening of the pinhole diaphragm. Thus an extremely fine mask scanning probe is obtained. For obtaining a similar resolution and a similarly fine probe with an electron beam, the latter would have to be changed from its wide diameter used for exposure to a focused state. When switching from a parallel to a focused beam, the operating parameters of column 1 would have to be changed to such an extent that there would be no controllable interrelation of their characteristics in the exposure and the measuring mode. Errors in the shadow projection image, caused by properties of the electron column 1 in FIG. 1 rather than by mask errors, could no longer be corrected.

The disadvantage of a very fine diaphragm is the low electron current passing it. For a diaphragm size with a lateral edge of 0.1 μm and an electron beam with a diameter of 1 mm and a current strength of 50 μA this current is about $5 \times 10^{-13}$ A. Each of these electrons generates in the scintillator 21 on an average two light flashes which are amplified in the photomultiplier 22 by a factor $10^6$, so that a 1 μA current pulse appears at the multiplier output. Such a pulse is sufficient for further processing. The time losses caused in the photomultiplier 22 by the rise time of the signal and its transit time are about 25 nsec. This delay displaces the measuring signal with respect to the actual position by about 2 nm if the beam, by changing its inclination, is displaced in 50 μsec. by the distance ±2 μm. This signal displacement is generally tolerable or may be compensated for by suitable electron means.

The previously described measuring method using a single hole diaphragm permits the relative position of selected mask points to be very accurately determined or images of small mask portions to be generated. In view of the time needed, it would be inexpedient to use this method to test the entire mask area, for example, for missing apertures or apertures covered by impurity particles. The further aspect of the present invention described below solves this problem by means of a diaphragm that is guided across the shadow projection image of the mask. This diaphragm has a plurality of regularly arranged holes behind each of which a highly responsive electron detector in integrated semiconductor design is arranged.

Figure 4:
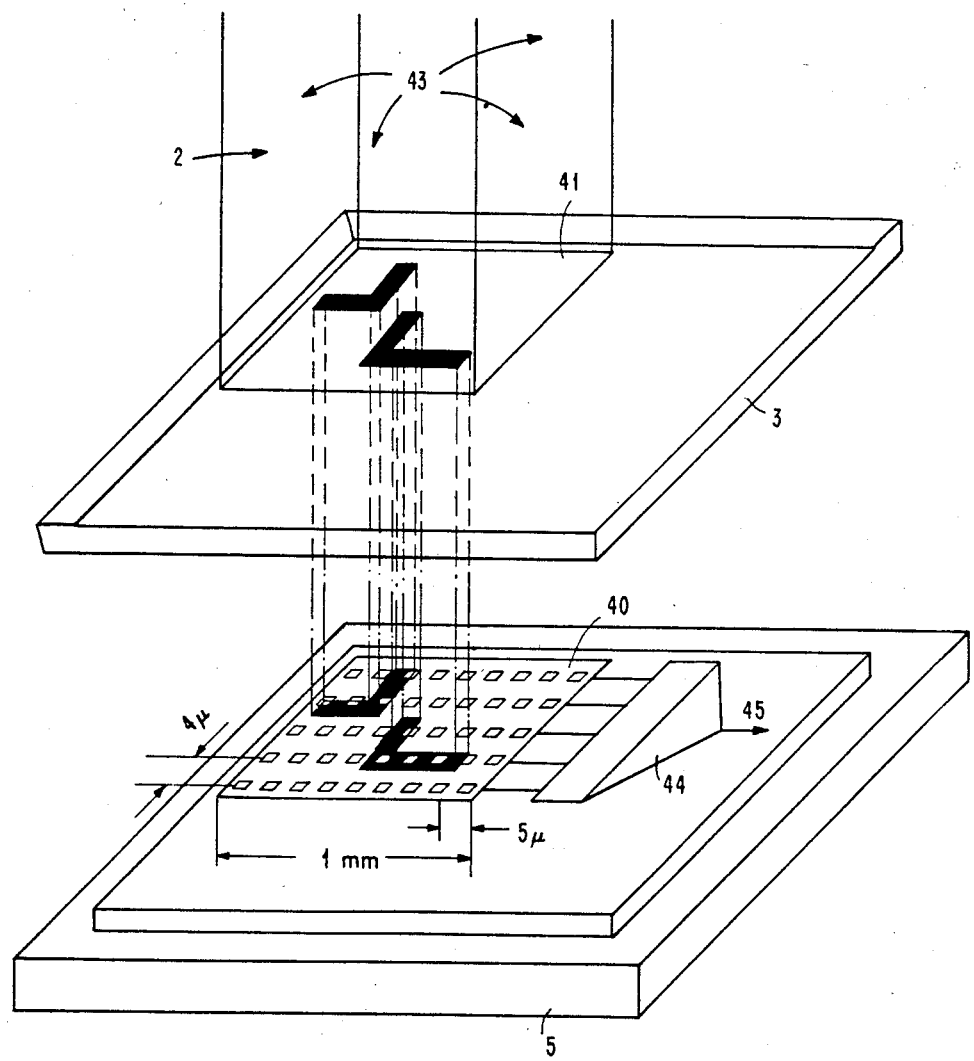
FIG. 4 is the schematic of how a mask for corpuscular beams is tested for impurity particles using the multihole diaphragm embodiment of the present invention.

FIG. 4 is a schematic of how the mask 3 is tested by a detector arrangement 40, wherein an electron detector in the form of an integrated semiconductor circuit is provided behind each hole of a multihole diaphragm. The detector arrangement is fixed to the X-Y table 5 which also carries the semiconductor wafer to be exposed later on and which at the beginning of the test is moved to a position below a selected portion 41 of the mask 3. The electron beam 2, whose cross-section is adapted to the shape of the detector arrangement, is then positioned with respect to that mask portion (comprising, for example, two L-shaped apertures), generating its shadow projection image on the detector arrangement 40. As a result, a charge distribution, corresponding to the shadow projection image, occurs in the semiconductor body of the detector arrangement 40 above which the multihole diaphragm is positioned. This charge distribution is subsequently converted into digital values in that the charge magnitude associated with each detector is sequentially read out to a read circuit 44 where it is amplified and digitized and fed via line 45 to other circuits (not shown) for further processing and storage. For amplifying the signals read out, low-capacity source cathode followers integrated in the detector arrangement are particularly suitable.

This first charge image read out is but an incomplete representation of the shadow projection image, as the area belonging to a mask portion 41 is scanned by the detector arrangement 40 only at points that are spaced from each other relatively widely; this spacing between adjacent apertures of the multihole diaphragm and thus also between adjacent detectors of the arrangement 40 is typically 4 $\mu$m. The apertures of the multihole mask are, for example, 0.5$\times$0.5 $\mu$m, their total number being 5$\times$10$^4$ in an area of 1$\times$1 mm which can be fully illuminated by the electron beam.

For gaplessly scanning the entire shadow projection area, the electron beam 2 is tilted in steps in four planes perpendicular to each other (as marked by arrows 43) after the first exposure; this causes the shadow image to be staggered by the width of the holes of the multihole mask and displaced in steps in meander fashion across the detector arrangement 40. In each exposure step, the digitized charge image is determined, so that upon completion of scanning, each point of the shadow projection image will have been scanned by one of the detectors of the arrangement 40. This yields a complete image of the shadow projection area whose resolution is determined by the size of the individual apertures in the multihole diaphragm.

For testing mask 3 in its entirety, the X-Y table with the detector arrangement 40 is subsequently moved to a position below the next portion of mask 3, and the above-described test with an inclined electron beam is repeated. Thus the entire area of mask 3 may be recorded by displacing the X-Y table in meander fashion.

The digital image of the mask 3 thus recorded may be tested for errors of the mask structure, for instance, by comparing that image with an ideal image derived from the design data of the mask by computation.

Such a detector arrangement permits the entire mask to be tested in a relatively short time. This time is about 6 minutes for a 9$\times$6 mm mask, if the above-described detector arrangement is used with 5$\times$10$^4$ integrated detectors. For each position of the X-Y table 80 single images are generated by inclining the electron beam.

An example of a detector arrangement of the kind described herein will be explained below with reference to the cross-sectional view in FIG. 5A and the plan view in FIG. 5B. The illustrated multihole diaphragm consists of a gold covering layer 50 with a thickness of several 1/10 $\mu$m over an integrated semiconductor circuit of the known charge carrier type. In the gold layer 50 holes 58$a$, 58$b$, arranged in a grid pattern, are defined by a photolithgraphic method. The diameter or lateral length of these holes is typically 0.5 $\mu$m and their spacings are typically of the order of several micrometers. In the example of FIG. 4, the spacing of two holes within a detector row is chosen to be 5 $\mu$m, while the row distance is 4 $\mu$m. The integrated semiconductor circuit under the gold layer 50 consists of a silicon substrate 55, covered by a silicon dioxide layer 54, aluminium electrodes 53 and 52 and an isolating layer 51 of, say, silicon nitride (Si$_3$N$_4$). The thickness of the SiO$_2$ layer is about $d_1 \sim 60$ nm, the thickness $d_3$ of the aluminium electrode 53 several 1/10 $\mu$m. Below the openings 58 of the gold layer 50, there are blind holes extending into the aluminium electrode 53, reducing its thickness to about $d_2 = 10$ nm at those points. This thin aluminium layer prevents the base of the blind holes from becoming electrically charged.

Together with one adjacent electrode 52, the electrodes 53 are alternately connected to one of two electrical terminals 56$a$, 56$b$ to which pulse trains, time shifted relative to each other, may be applied (so-called two-phase charge transfer device). The electrodes 53 together with the SiO$_2$ layer 54 and the substrate 55 constitute a MOS capacitor, under which, in response to the application of a negative bias to the electrodes 53, a potential well 57 is formed. If high-energy electrons (about 10 kV) are incident on the blind holes 58, only a small proportion of them (less than 10%) is absorbed by the very thin aluminium layer, the remaining electrons reaching the silicon layer 55 without any substantial loss of energy, essentially generating in that layer (each 10 keV electron about 1000) electron hole pairs, so that a charge proportional to electron beam exposure accumulates in the potential well 57. By the known principle of charge transfer systems, such charges may be transferred to the output circuits 44 through silicon substrate 55 by applying pulse-shaped voltages to the electrodes 56$a$, 56$b$.

Figure 5A:
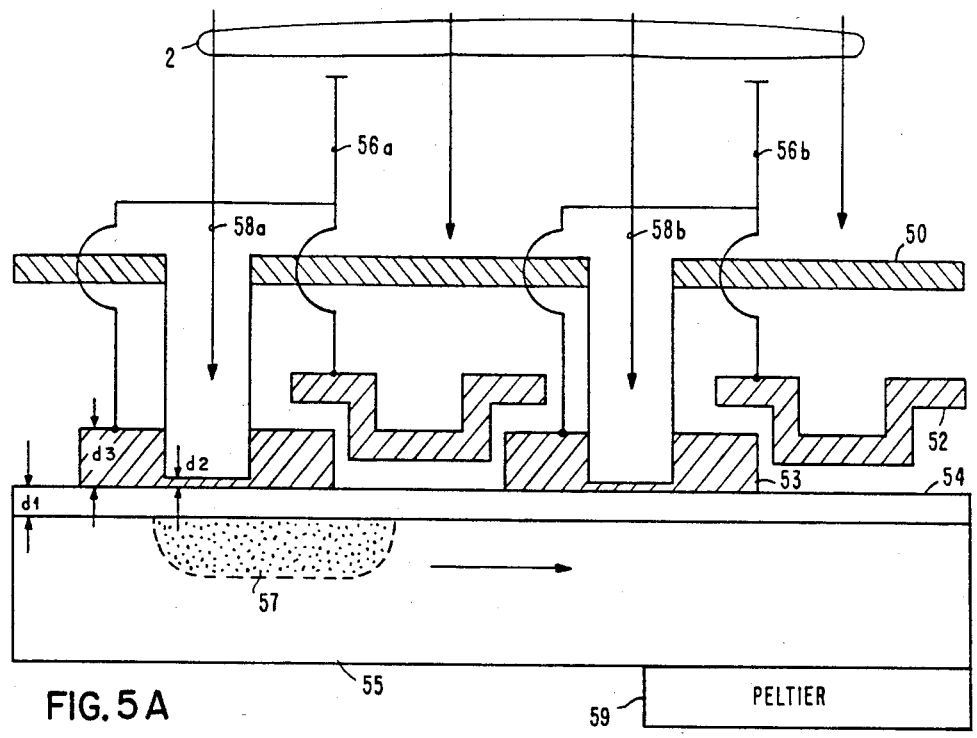
FIG. 5A is the schematic of a cross-section of the multihole diaphragm embodiment of the invention according to FIG. 4 with charge transfer elements arranged thereunder in a semiconductor body.
Figure 5B:
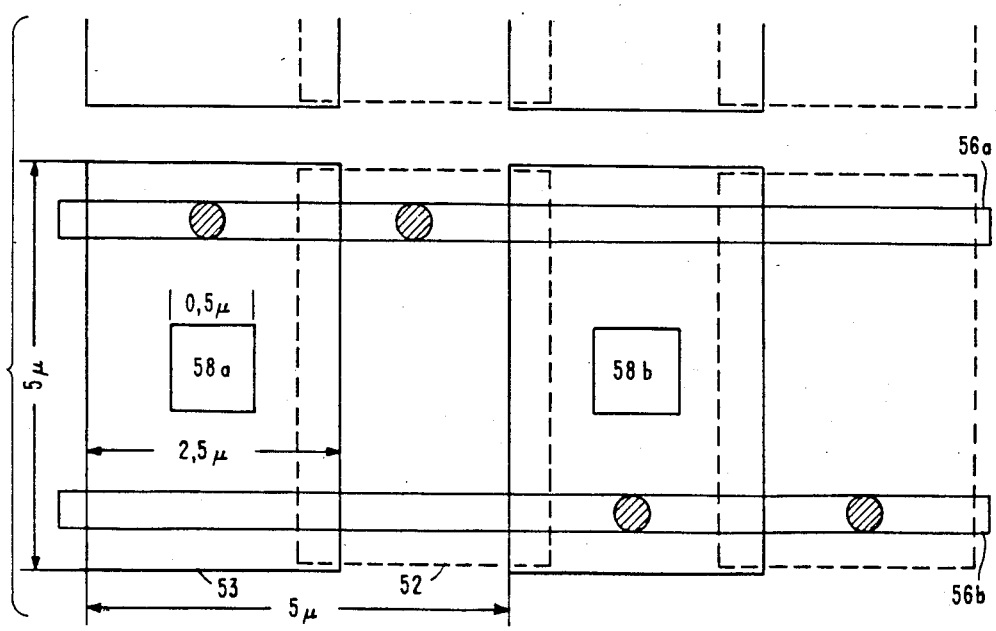
FIG. 5B is the plan view of the multihole diaphragm embodiment of the present invention according to FIG. 5A.

The electrode structure schematically illustrated in FIG. 5A constitutes a so-called two-phase charge transfer circuit. Other prior art configurations of such charge transfer systems may also be used for the present invention. The charge that has accumulated in each detector after all detectors positioned underneath the 5$\times$10$^4$ blind holes 58 have been simultaneously exposed by the electron beam is sequentially fed to the output circuits, amplified and converted into binary digits (0, 1) by suitable discriminator circuits (not shown). The output amplifiers are best integrated directly with the charge transfer system. The charge transfer device must be manufactured such that a high efficiency is obtained when the charge packages are transferred from one detector position to another (e.g., 99.9%, as were previously achieved by prior art means); in addition, the dark current of the device, which occurs when electron hole pairs are generated by processes other than incident electrons, must be reduced to a minimum. One way of reducing the dark current is to cool the silicon substrate 55, for example, by a Peltier element 59 connected thereto. The illumination time necessary for accumulating a sufficiently large charge in the potential wells is about 1 msec., even if electron beams with a low current strength are used for mask illumination to reduce the heating of the mask. For sequentially reading the stored charge image, a time of about 100 msec. is required at a clock frequency of 1 Mhz (which is technically feasible without any difficulty). For 20 single exposures by beam tilting and 54 displacement positions of the detector (corresponding to its area of 1×1 mm under a mask of 9×6 mm) the total time required for recording the mask image with a resolution of 0.5 μm is about 6 minutes.

The thin metal layer at the base of the blind holes 58 is primarily used, as previously mentioned, to prevent electrostatic charges caused by the incident electron current; for tests carried out in practice, detector arrangements 40, whose blind holes were not provided with a metal layer, have already been used to good effect. At the small cross-section of these holes, the operation of the charge transfer circuit is not adversely affected if there is no metal layer (which also forms part of the electrode of the charge transfer device circuit).

Blind holes with a metal layer may be readily produced, for instance, by the lift-off process. For that purpose, the wafer areas destined for the blind holes are covered with a photolithographically defined photoresist layer followed by an $Si_3N_4$ layer. The photoresist is subsequently removed in a lift-off process, and a further thin metal (Al) film is deposited (by vapor deposition or cathode sputtering) covering the existing metal pattern and the bare portions of the wafer which form the base of the blind holes in later manufacturing steps. For that purpose, the thickness of the second metal layer is chosen suitably small.

While the invention has been particularly shown and described with reference to a preferred embodiment thereof it will be understood by those skilled in the art that the foregoing and other changes in form and detail may be made therein without departing from the spirit and scope of the invention.

What is claimed is:

1. An Apparatus for detecting errors in exposure masks for corpuscular beam lithography, comprising an image mask,
    a pinhole diaphragm, located beneath said image mask, having a pinhole with submicron dimensions therein,
    means for forming a corpuscular beam,
    means for forming a projection image of selected mask regions of an exposure mask under review,
    means for tilting the corpuscular beam and guiding the beam, in at least one plane through said mask and across said pinhole in said diaphragm, and
    a corpuscular beam detection means positioned below said diaphragm for detecting the beam passing through said pinhole in said diaphragm in order to detect errors in said mask.

2. The apparatus of claim 1 wherein there are means for positioning a semiconductor substrate below said mask and said corpuscular beam is used for exposing semiconductor substrates through said mask.

3. The apparatus of claim 2 wherein said positioning means comprises an X-Y table for positioning the substrate to be exposed to said corpuscular beam.

4. The apparatus of claim 1 wherein said diaphragm has a single aperture therein, and said detector means comprise a scintillator and a secondary electron multiplier.

5. The apparatus of claim 3 wherein there is further provided means for determining the sum of the interferometric displacement of said X-Y table below said mask, and the relative position between said mask point and said pinhole diaphragm.

6. The apparatus of claim 5 wherein there is further provided means for establishing the relative position between said mask point and said pinhole diaphragm by tilting said corpuscular beam.

7. The apparatus of claim 1 wherein said diaphragm has a multitude of submicron apertures therein and said apertures are arranged in matrix fashion.

8. The apparatus of claim 7, characterized in that the pinhole diaphragm forms part of an integrated circuit of the charge transfer type, and that below each of the apertures of the pinhole diaphragm there is at least one blind hole thin electrode metal oxide semiconductor (MOS) transistor arranged such that the corpuscular beams entering the blind holes permeate the substrate of the charge transfer device only slightly attenuated.

9. The apparatus of claim 8, characterized in that for recording a complete mask shadow projection image, the multiaperture diaphragm is shifted in steps below the mask, with the shadow image of the respective mask section being completely scanned at each position by tilting the electron beam in steps in at least two planes perpendicular to each other such that the shadow image is in each case displaced in meander fashion by one aperture width of the multihole diaphragm, and that after each tilt of the corpuscular beam, the charges stored in the substrate of the integrated circuit are sequentially read out.

10. The apparatus of claim 9, characterized in that the scanned shadow projection images of the mask are digitized and compared with stored design data of the mask for error detection.

* * * * *